(12) United States Patent
Fernandez Sanmiguel et al.

(10) Patent No.: US 12,316,070 B2
(45) Date of Patent: May 27, 2025

(54) LASER CONNECTION MODULE

(71) Applicant: MONOCROM S.L., Vilanova i la Geltru (ES)

(72) Inventors: Luis Jorge Fernandez Sanmiguel, Vilanova i la Geltru (ES); Carles Oriach Font, Vilanova i la Geltru (ES); German Franco Blanes, Vilanova i la Geltru (ES); Ezequiel Patricio Fresquet Martinez, Vilanova i la Geltru (ES); Gemma Safont Camprubi, Vilanova i la Geltru (ES); Eduard Carbonell Sanroma, Vilanova i la Geltru (ES)

( * ) Notice: Subject to any disclaimer, the term of this patent is extended or adjusted under 35 U.S.C. 154(b) by 579 days.

(21) Appl. No.: 17/768,163

(22) PCT Filed: Oct. 17, 2019

(86) PCT No.: PCT/ES2019/070707
§ 371 (c)(1),
(2) Date: Apr. 11, 2022

(87) PCT Pub. No.: WO2021/074460
PCT Pub. Date: Apr. 22, 2021

(65) Prior Publication Data
US 2023/0138461 A1    May 4, 2023

(51) Int. Cl.
*H01S 5/02365* (2021.01)
*H01S 5/02208* (2021.01)
(Continued)

(52) U.S. Cl.
CPC ...... *H01S 5/02365* (2021.01); *H01S 5/02208* (2013.01); *H01S 5/4025* (2013.01); *H01S 5/02423* (2013.01)

(58) Field of Classification Search
CPC .......................... H01S 5/02365; H01S 5/4018
(Continued)

(56) References Cited

U.S. PATENT DOCUMENTS 4,315,225 A * 2/1982 Allen, Jr. .............. H01S 5/0237
257/726
4,716,568 A * 12/1987 Scifres .................... H01S 5/023
372/36
(Continued)

FOREIGN PATENT DOCUMENTS

| CN | 104577707 A | 4/2015 |
| EP | 1113543 A1 | 7/2001 |
| ES | 2191559 A1 | 9/2003 |

OTHER PUBLICATIONS

International Search Report for corresponding PCT/ES2019/070707, dated Jul. 7, 2020. [English Translation].
(Continued)

*Primary Examiner* — Tuan N Nguyen
(74) *Attorney, Agent, or Firm* — Egbert, McDaniel & Swartz, PLLC

(57) ABSTRACT

A laser connection module including: multiple superposed electrodes connected in alternating order with opposite electricity supply poles; at least one laser diode mounted between the opposite surfaces of consecutive electrodes, making contact with them; an external structure delimiting an open space located along a light-emitting area of the laser diodes and suitable for containing the set of superposed electrodes and laser diodes; at least one tightener mounted on a first end of the external structure and which presses the set of electrodes and laser diodes against a second opposite end of the structure, establishing the fixation and mutual contact thereof; and an intermediate protective plate dis-
(Continued)

posed between the at least one tightener and the end electrode closest to the at least one tightener.

9 Claims, 5 Drawing Sheets

(51) Int. Cl.
    *H01S 5/024*     (2006.01)
    *H01S 5/40*     (2006.01)

(58) Field of Classification Search
    USPC .................................................... 372/38.05
    See application file for complete search history.

(56) References Cited

U.S. PATENT DOCUMENTS

| | | |
|---|---|---|
| 5,978,396 A | 11/1999 | Duchemin et al. |
| 6,151,341 A | 11/2000 | Bull et al. |
| 6,245,589 B1 | 6/2001 | Takigawa et al. |
| 2013/0051414 A1* | 2/2013 | Grove ................... H01S 5/024 |
| | | 372/36 |

OTHER PUBLICATIONS

Written Opinion of the International Searching Authority for corresponding PCT/ES2019/070707, dated Jul. 7, 2020.

\* cited by examiner

LASER CONNECTION MODULE

OBJECT OF THE INVENTION

The invention, as expressed in the wording of the description herein, refers to a laser connection module providing structural and constitutive characteristics, which will be described in detail below, that significantly improve the current state of the art within their field of application.

More particularly, the object of the invention focuses on a module of the type intended to serve as a fastening device for the electrical connection and thermal contact between laser diodes and electrodes stacked successively between corresponding spacers, being able to have internal conduits for the circulation of a cooling fluid, with the advantage of having an improved structural configuration that allows, on the one hand, the fastening and keeping together of all its components, and on the other hand, so as to ensure that such electrical connection is secure, the controlled application of the clamping force directly on the laser diodes and at the point where they meet to ensure electrical and thermal contact between the electrodes and diodes.

FIELD OF APPLICATION OF THE INVENTION

The field of application of the invention herein is framed within the industrial sector dedicated to the manufacture of devices and components for laser technology equipment.

BACKGROUND OF THE INVENTION

In some of the laser modules of the type currently known and referred to herein, the laser diodes, also called chips or bars, were mounted on at least one of the electrodes by means of welding, which poses several problems.

The main problem is that the laser chip must be positioned with extreme precision, so that its end protrudes between eight and ten microns from the end of the electrode so that the welded connection that will join it to said electrode does not reach the epitaxy, because if it does, the laser module will be faulty.

In order to correctly position the laser chip with respect to the electrodes and the welded connection of said electrodes with acceptable precision, micro-robots and other high-precision devices were required, entailing a very large investment.

In addition, the welded connection of the laser chip does not allow subsequent adjustment of its position or its replacement in case of failure.

Another problem was that the different expansion coefficients between the laser chip and the materials used in the welded connection and the electrode lead to the possibility of alterations in the laser chip, causing the chip to bend.

To overcome this problem, Patent Document U.S. Pat. No. 5,978,396 describes a semiconductor laser source including a stack of semiconductor laser diodes, each having at least one active region. The active region includes a series of semiconductor layers located between an ohmic contact layer and a substrate, which also assumes the function of an ohmic contact layer. Pressure causes the diodes to maintain contact with each other through their ohmic contact layers. Each diode has dimensions, especially in its thickness, that allow the transient heating of each diode to be as low as possible and such that the average heating of the stackable diodes does not exceed a predetermined value.

Patent Document U.S. Pat. No. 6,151,341 describes a stackable integrated diode pack, wherein a stack of laser elements, configured to absorb the heat given off by said laser elements, is proposed to allow for their repair and/or replacement, and testing. The assembly comprises cells which have a cavity for the passage of a coolant to cool the laser elements. The cells can be individually constructed for individual testing and then stacked together and secured detachably for easy replacement.

The cell cavities form a substantially contiguous cavity through which the coolant enters and exits the entire assembly. The cell cavities include regions and surfaces that enhance coolant flow to regions substantially adjacent to the laser elements, to cool said laser elements.

Patent Document U.S. Pat. No. 6,245,589 describes the manufacture of a device for cooling a planar light source, which includes a device for cooling an array of laser diodes using a stacking of a plurality of metal plates, formed with a grooved pattern with arms or openings, which act as a cooling water circulation path for said laser diodes.

And, improving on such solutions, Patent Document ES2191559B1, whose holder is the applicant of the invention herein, proposes a laser connection module, comprising:—electrodes mutually facing each other and connected in an alternating order with opposite poles; insulating spacers arranged between the facing surfaces of the electrodes to prevent direct contact of the electrodes and their short-circuit; laser chips mounted between the facing surfaces of said electrodes, making contact with the electrodes; —and a clamping means responsible for drawing together the electrodes mutually facing each other to ensure their contact with the laser chips positioned between them, ensuring the electrical power supply to said laser chips and the dissipation of the heat generated.

In said invention, the aforementioned clamping means consist of screws mounted on through holes affecting the electrodes and the insulating spacers, and of corresponding nuts which thread on said screws, the heads of the screws and the nuts acting directly on the outer surface of the two electrodes occupying the end positions in the laser module.

Although this laser module effectively solves the above-mentioned problem of guaranteeing a secure connection between the diodes and the electrodes, allowing for easy adjustment and/or replacement of the electrodes, it has certain problematic aspects that could be improved upon.

In particular, one of the disadvantages is the risk of damage to the end electrodes, due to the screw heads and the respective nuts in the clamping areas acting directly on them, taking into account: on the one hand, that these electrodes are made of a relatively soft electrically conductive material, such as copper and, on the other hand, that the section of the electrodes is reduced in said clamping areas by the holes made for the mounting of the screws.

An additional disadvantage of the invention disclosed in Patent Document ES2191559B1 is that the upper and lower end electrodes are exposed, without any element of protection against possible accidental impacts, which increases the risk of damage to the laser module.

The objective of the invention herein is, therefore, to provide an improved laser module that performs a correct fastening between all the stacked components of the module, protects the end electrodes so that they are not exposed to accidental impacts, and ensures that the screws and nuts of the clamping elements do not act directly on said end electrodes, hence preventing them from being damaged.

The applicant is unaware of the existence of any prior art with the technical, structural and functional characteristics similar to those of the invention herein.

EXPLANATION OF THE INVENTION

The laser connection module, the subject matter of the invention, with the technical characteristics set forth in claim 1, satisfactorily solves the above-mentioned drawbacks.

In particular, the laser connection module of the invention is of the type employed for the electrical connection between laser diodes and alternately stacked electrodes and laser diodes, and can be provided with internal conduits for the circulation of a cooling fluid.

This laser connection module has technical characteristics that make it possible to fasten all its components and keep them together, and simultaneously provide protection to the end electrodes, preventing them from being damaged due to an accidental impact, or due to the clamping screws and nuts acting directly on said end electrodes; and without said clamping screws going through the electrical power supply electrodes of the laser diodes.

More specifically, this laser connection module is of the type described in the preamble of claim 1 comprising: several superimposed electrodes, connected in an alternating order with opposite electrical power supply poles; at least one laser diode mounted between the facing surfaces of consecutive electrodes, making contact with said electrodes; and a means for clamping the assembly of electrodes and laser diodes together.

According to the invention, to achieve the proposed objectives, this laser connection module comprises:
  an external structure that delimits a space defined by a light emission zone of the laser diodes and suitable for housing the assembly of laser diodes and electrodes superimposed in an alternating order,
  a clamping means mounted on a first end of the structure, which presses the assembly of electrodes and laser diodes against a second opposite end of said structure, establishing their fastening and the mutual contact of the laser diodes with the consecutive electrodes, and,
  an intermediate protection plate arranged between the clamping means and the end electrode closest to said clamping means.

Said external structure comprises: an upper part forming the first end of the structure; a lower part forming the second end of the structure and a means for fastening said upper and lower parts in a parallel position, separated vertically at a suitable distance for the unconstricted housing of the electrode and laser diode assembly between said upper and lower parts; so that the clamping means is responsible for pressing the electrode and laser diode assembly against the lower part of the structure.

The external structure provides adequate protection for the electrode and laser diode assembly, while serving as a support for the clamping means responsible for pressing the electrode and laser diode assembly against the lower part or second end of the structure, without said clamping means passing through or weakening any of the elements of the above-mentioned assembly.

The clamping means comprises clamping studs mounted in threaded holes defined for this purpose in the upper part or first end of the structure.

In turn, the intermediate plate, arranged between the clamping studs and the upper electrode closest to them, is made of a resistant material which is harder than the electrodes, its function being to prevent the clamping studs from damaging the upper electrode during the tightening of said studs.

The means for fastening the upper and lower parts of the structure can have different configurations, being composed of fastening screws; or of tubular spacers arranged between the upper and lower parts and mounted on the fastening screws; or of guide columns arranged between the upper and lower parts and fastened at their ends to the said upper and lower parts. In any case; said fastening means guarantees an adequate separation between the upper and lower parts of the structure, for the unconstricted housing of the assembly of electrodes and laser diodes.

The laser connection module includes a means for aligning the successive electrodes in a vertical direction which, depending on the means for fastening the structure, may consist of pins housed in vertical holes made for this purpose in the successive electrodes, or of the guide columns themselves; in the second case, the electrodes have recesses in their contour that are of a configuration complementary to a portion of the section of the guide columns and suitable for the assembly of the electrodes, as a sliding element, between said guide columns; said guide columns forming simultaneously a means for separating the upper and lower parts of the structure and a means for vertically aligning the electrodes.

In one embodiment of the invention, the laser diodes are arranged between some front ends of the electrodes, the module comprising electrically insulating spacers located between rear ends of said consecutive electrodes and of a thickness similar to that of the laser diodes, said spacers preventing the consecutive electrodes from touching each other and causing a short circuit.

In this embodiment of the module, the clamping means comprises front studs that clamp the front end of the electrodes against the laser chips and rear studs that clamp the rear end of the electrodes against the electrically insulating spacers, said front and rear studs compensating the clamping on the respective ends of the electrodes.

DESCRIPTION OF THE DRAWINGS

To complement the description being made and in order to provide a better understanding of the characteristics of the invention, the description herein is accompanied by drawings, as an integral part of the same, in which the following has been represented for illustrative and non-limiting purposes.

PREFERRED EMBODIMENT OF THE INVENTION

Figure 1:
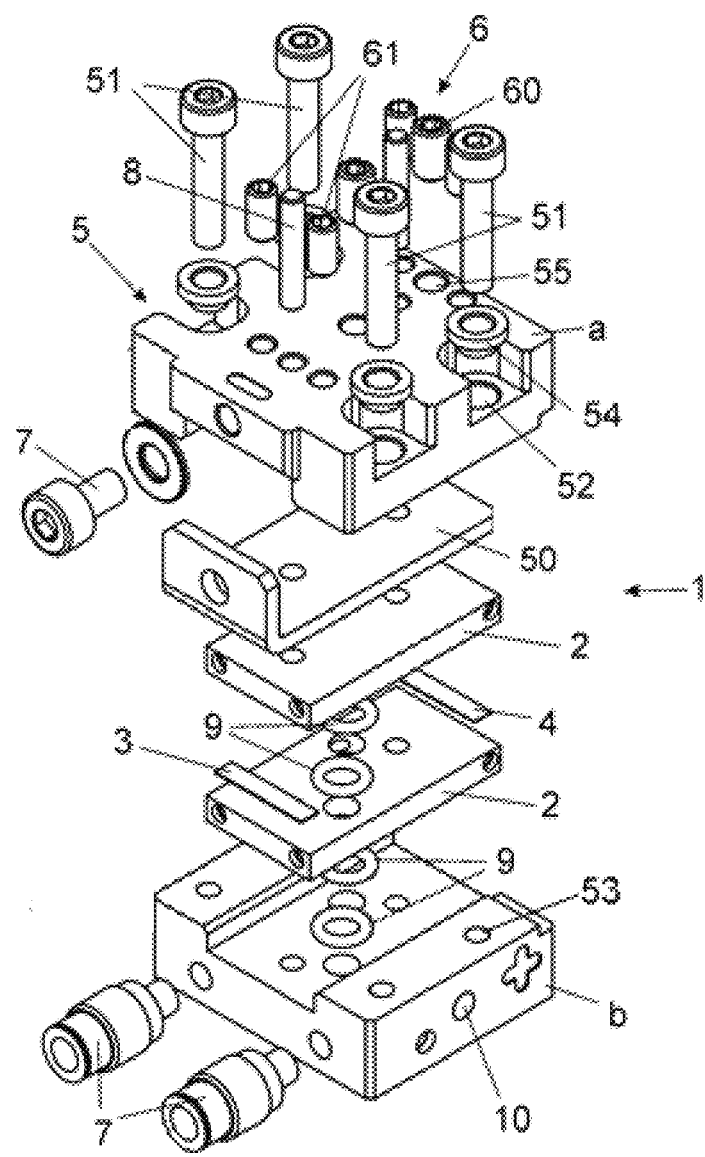
FIG. 1 shows a perspective exploded view of an example of an embodiment of the laser connection module, the subject matter of the invention, provided with a single laser diode.
Figure 2:
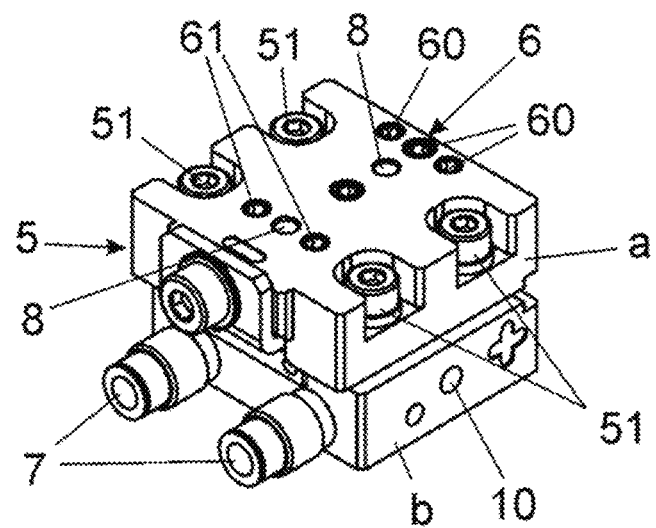
FIG. 2 shows a perspective view of the laser connection module of FIG. 1, once assembled.
Figure 3:
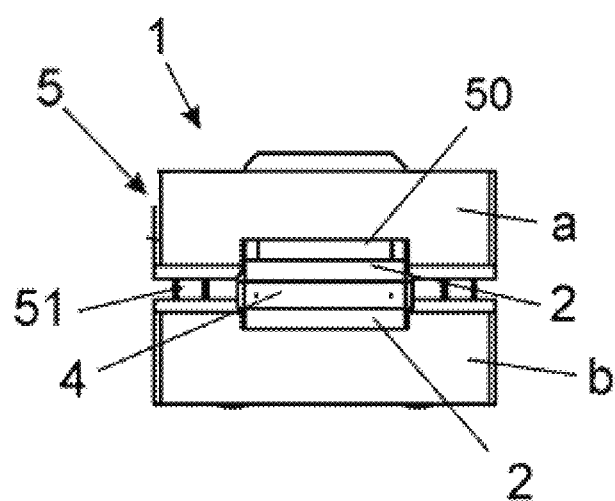
FIGS. 3, 4 and 5 show front, side and top elevation views, respectively, of the laser connection module of the preceding figures, in an assembled position.
Figure 4:
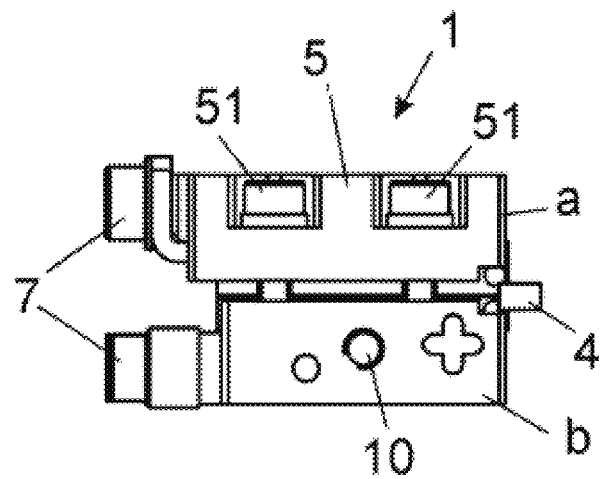
Figure 5:
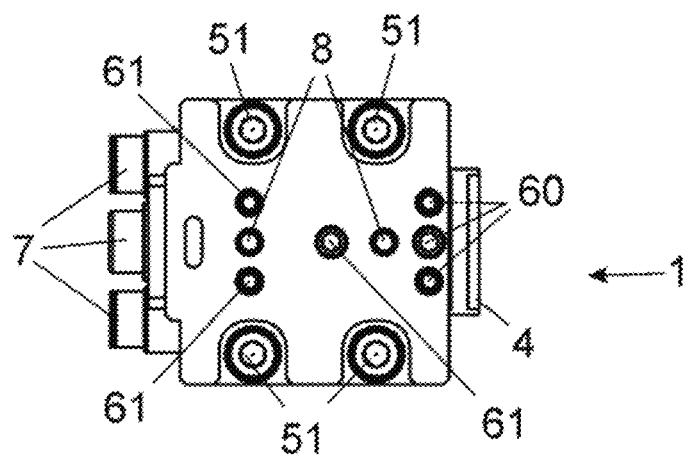

In view of the aforementioned figures, and in accordance with the adopted numbering, two non-limiting embodiment examples of the recommended laser connection module can be seen, comprising the parts and elements indicated and described in detail below.

In the embodiment example shown in FIGS. 1 to 5, the laser connection module (1) comprises: electrodes (2) connected in an alternating order with opposite poles of electrical power supply; a spacer (3) arranged between the facing surfaces of the consecutive electrodes (2) to prevent their direct contact and short-circuit, a laser diode (4) mounted between the facing surfaces of consecutive electrodes (2), making contact with them in the area left free by the corresponding spacer (3); and a clamping means (6) for clamping the assembly of electrodes (2) and laser diodes (4) to each other.

The spacer (3) has a smaller surface than the facing surfaces of the electrodes (2).

According to the invention, the module (1) comprises an external structure (5) delimiting a space defined by a light emission zone of the laser diode (4) and suitable for housing the electrode assembly (2) and laser diodes (4); the clamping means (6) is mounted on a first end of the structure (5) and presses the assembly of electrodes (2) and laser diodes (4) against a second opposite end of said structure, establishing their fastening and the mutual contact of the laser diodes (4) with the consecutive electrodes (2).

The module (1) comprises, between the clamping means (6) and the end electrode (2) closest to said clamping means (6), an intermediate plate (50) protecting said end electrode (2).

The external structure (5) comprises:—an upper part (a) forming the first end of the structure (5) and provided with threaded holes (55) in which studs (60) are mounted forming part of the clamping means (6), —a lower part (b) forming the second end of the structure (5), and—a means for fastening said upper (a) and lower (b) parts in a parallel position, vertically separated at a suitable distance for the unconstricted housing of the electrode and laser diode assembly between said upper and lower parts.

In this first embodiment, the means for fastening the upper (a) and lower (b) parts of the external structure (5) comprises fastening screws (51) mounted, with the insertion of washers (54), in through holes (52) defined in the upper part (a) and inserted into threaded holes (53) of the lower part (b), allowing an adjustment of the gap between the upper (a) and lower (b) parts of the external structure (5).

The module (1) has connectors (7) for a wiring (not shown) of the electrical power supply of the electrodes (2), and internal conduits (10) for the circulation of a cooling product.

In this embodiment, the module (1) includes a means for vertically aligning the successive electrodes (2), consisting of pins (8) housed in vertical holes made for this purpose in the successive electrodes (2) and in the upper (a) and lower (b) parts of the external structure (5); seals (9) are interposed between these elements to prevent leakage.

In said embodiment, the laser diodes (4) are arranged between the front ends of the electrodes (2), and the spacers (3), electrically insulating and of a similar thickness to the laser diodes (4), are arranged between consecutive rear ends of the electrodes (2).

In this particular embodiment the clamping means comprises: front studs (60) which press the front end of the electrodes (2) against the laser diodes (4), and rear studs (61) which press the rear end of the electrodes (2) against the electrically insulating spacers (3).

Figures 6, 7:
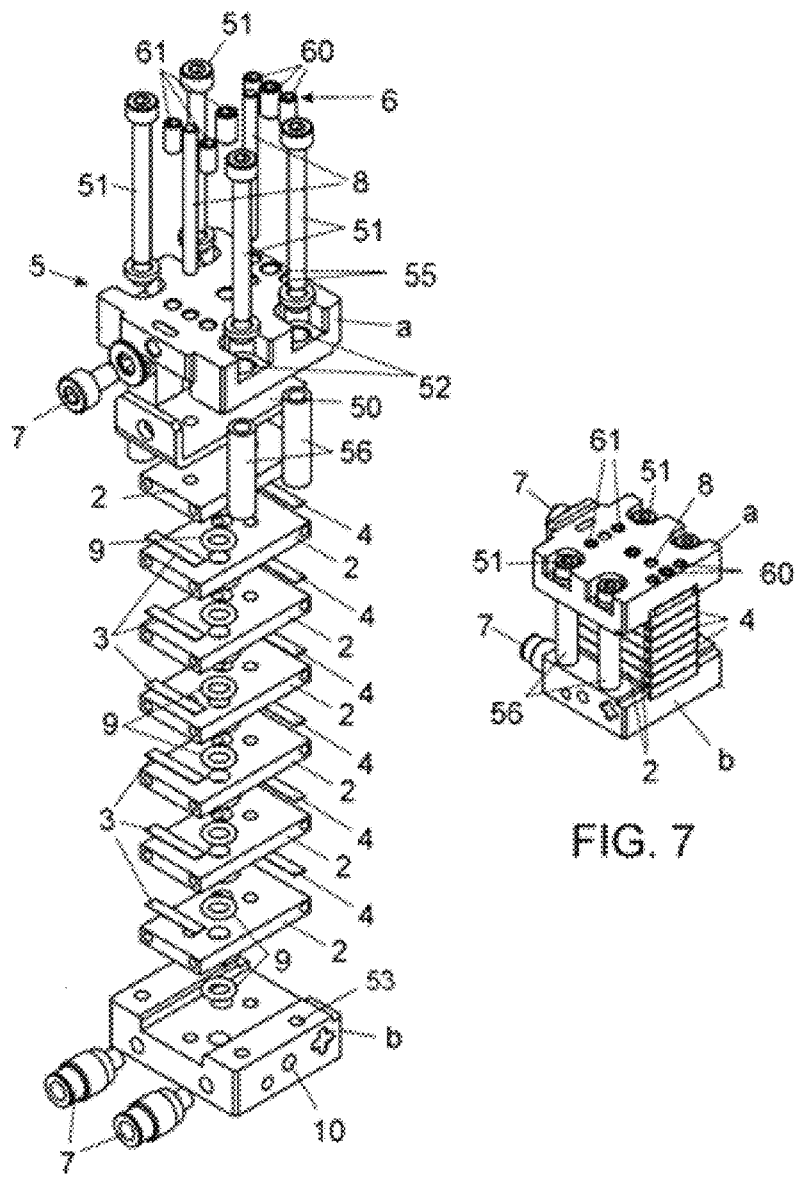
FIG. 6 shows a perspective exploded view of a first embodiment variant of the laser connection module according to the invention, which in this case comprises multiple laser diodes alternating with respective electrodes.
FIG. 7 shows a perspective view of the laser connection module of FIG. 6, once assembled.

In the first embodiment variant, shown in FIGS. 6 and 7, the laser connection module has a configuration similar to that described above, incorporating in this case a larger number of electrodes (2) and laser diodes (4) stacked in an alternating order.

In this embodiment, the means for fastening the upper (a) and lower (b) parts of the structure (5) comprises tubular spacers (56), arranged between said upper (a) and lower (b) parts and mounted on the fastening screws (51), said tubular spacers (56) being precisely those that determine the separation between the upper (a) and lower (b) parts.

Figure 8:
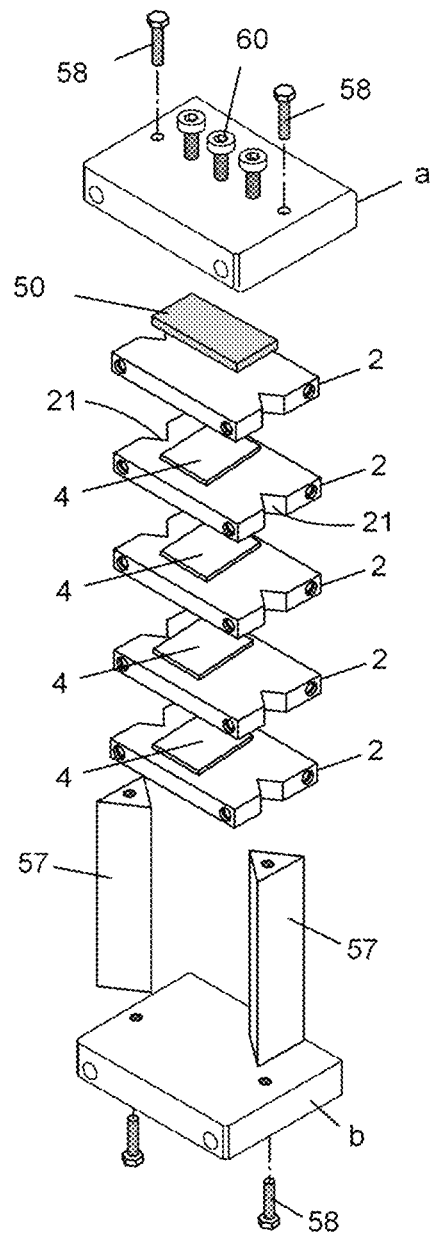
FIG. 8 shows a perspective exploded view of an embodiment variant of the laser connection module, in which the structure includes guide columns that are part of the means for fastening the upper and lower parts and vertically aligning the electrodes.
Figure 9:
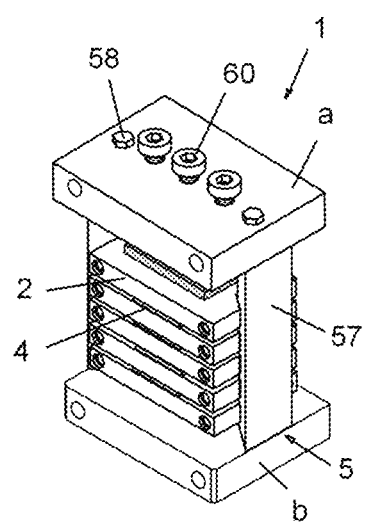
FIG. 9 shows a perspective view of the laser connection module of FIG. 8, in an assembled position.

In FIGS. 8 and 9, the means for fastening the upper (a) and lower (b) parts of the structure (5) comprises guide columns (57) arranged between the upper (a) and lower (b) parts, and fastened at their ends by means of screws (58) to said upper and lower parts.

In this embodiment, the electrodes (2) have recesses (21) in their contour, said recesses being of a complementary configuration to a portion of the section of the guide columns (57) and suitable for the mounting of the electrodes (2), as a sliding element, between the guide columns; said guide columns (57) forming simultaneously a means for separating the upper (a) and lower (b) parts of the structure and a means for vertically aligning the electrodes (2).

The use of these guide columns (57) is advantageous with respect to the previous embodiments, since it allows elimination of the pins (8) and arrangement of the studs (60), forming the clamping means (6), in a centered position with respect to the assembly of electrodes (2) and laser diodes (4), avoiding the use of the electrically insulating spacers (3) and of a second set of studs (61) for pressing the electrodes (2) against said spacers (3).

Having sufficiently described the nature of the invention and having given an example of a preferred embodiment, it is hereby stated for pertinent purposes that the materials, shape, size and arrangement of the elements described may be modified, provided there is no alteration of the essential features of the invention claimed below.

The invention claimed is:

1. A laser connection module comprising:
   a plurality of superimposed electrodes connected alternately with opposing electrical power supply poles;
   at least one laser diode mounted between and in contact with facing surfaces of consecutive electrodes of said plurality of superimposed electrodes;
   a clamping structure that connects said plurality of superimposed electrodes with said at least one laser diode;
   an external structure having a space with a light emissions zone of said at least one laser diode, said external structure housing said clamping structure of said plurality of superimposed electrodes and said at least one laser diode, said clamping structure comprising studs mounted on threaded holes at one end of said external structure, said clamping structure urging said plurality of superimposed electrodes and said at least one laser diode against an opposite end of said external structure so as to establish contact of said at least one laser diode with a facing surface of the consecutive electrodes, said external structure comprising:

an upper part forming the one end of said external structure;

a lower part forming the opposite end of said external structure; and a fastener that fastens said upper part and said lower part in parallel relation, said upper part and said lower part being vertically separated by a suitable distance for an unconstricted housing of said plurality of superimposed electrodes and said at least one laser diode between said upper part and said lower part; and an intermediate protection plate positioned between the clamping structure and an end electrode of said plurality of superimposed electrodes closest to said clamping structure.

2. The laser connection module of claim 1, wherein said upper part is fastened to said lower part with fastening screws.

3. The laser connection module of claim 2, wherein said fastener is a plurality of tubular spacers positioned between said upper part and said lower part, wherein the plurality of tubular spacers are mounted on the fastening screws.

4. The laser connection module of claim 3, further comprising:

a plurality of pins housed in aligned vertical holes in the consecutive electrodes and in at least one of said upper part and said lower part of said external structure.

5. The laser connection module of claim 3, wherein said at least one laser diode is arranged between front ends of said plurality of superimposed electrodes, the laser connection module further comprising:

electrically insulating spacers located between consecutive rear ends of said plurality of superimposed electrodes, said electrically insulating spacers having a thickness corresponding to a thickness of said at least one laser diode.

6. The laser connection module of claim 5, said clamping structure further comprising:

a plurality of front studs that urge a front end of said plurality of superimposed electrodes against said at least one laser diode; and a plurality of rear studs that urge a rear end of said plurality of superimposed electrodes against said electrically insulating spacers.

7. The laser connection module of claim 1, wherein said fastener comprises:

a plurality of guide columns arranged between said upper part and said lower part and fastened thereto by screws to said upper part and said lower part.

8. The laser connection module of claim 7, wherein each of said plurality of superimposed electrodes has a recess complementary to a portion of a respective guide column of said plurality of guide columns so as to assemble said plurality of superimposed electrodes as respective sliding elements between adjacent guide columns of said plurality of guide columns, said plurality of guide columns separating said upper part of said lower part of said external structure and to vertically align said plurality of superimposed electrodes.

9. The laser connection module of claim 1, wherein the front studs are centered relative to the assembly of said plurality of superimposed electrodes and said at least one laser diode.

* * * * *